United States Patent
Schneider (10) Patent No.: US 9,964,619 B2
(45) Date of Patent: May 8, 2018

(54) METHOD AND MAGNETIC RESONANCE APPARATUS FOR DETERMINATION OF RADIO-FREQUENCY PULSES

(71) Applicant: Siemens Aktiengesellschaft, Munich (DE)

(72) Inventor: Rainer Schneider, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 715 days.

(21) Appl. No.: 14/627,207

(22) Filed: Feb. 20, 2015

(65) Prior Publication Data
US 2015/0234025 A1   Aug. 20, 2015

(30) Foreign Application Priority Data
Feb. 20, 2014   (DE) .................. 10 2014 203 057

(51) Int. Cl.
*G01R 33/54* (2006.01)
*G01R 33/34* (2006.01)
(Continued)

(52) U.S. Cl.
CPC ..... *G01R 33/543* (2013.01); *G01R 33/34092* (2013.01); *G01R 33/443* (2013.01); *G01R 33/4818* (2013.01); *G01R 33/4833* (2013.01); *G01R 33/546* (2013.01); *G01R 33/243* (2013.01); *G01R 33/246* (2013.01); *G01R 33/482* (2013.01); *G01R 33/5608* (2013.01); *G01R 33/5612* (2013.01)

(58) Field of Classification Search
CPC ............ G01R 33/543; G01R 33/34092; G01R 33/443; G01R 33/4818; G01R 33/546; G01R 33/243; G01R 33/246; G01R 33/482; G01R 33/4833; G01R 33/5608; G01R 33/5612
See application file for complete search history.

(56) References Cited

U.S. PATENT DOCUMENTS 4,968,938 A * 11/1990 Pines .................. G01R 33/307
                                                324/307
4,968,939 A * 11/1990 Pines .................. G01R 33/307
                                                324/321
(Continued)

OTHER PUBLICATIONS

Grissom et al. "Spatial Domain Method for the Design of RF Pulses in Multicoil Parallel Excitation", in: Magnetic Resonance in Medicine vol. 56, pp. 620-629 (2006).
(Continued)

*Primary Examiner* — Dixomara Vargas
(74) *Attorney, Agent, or Firm* — Schiff Hardin LLP (57) ABSTRACT

In a method and magnetic resonance apparatus for determination of radio-frequency pulses, a time-parallel transmission of a radio-frequency pulse influences the transverse magnetization of an object under examination in a specified spatial region. The spatial region is depicted as a vector and approximated by decomposition into a finite number of weighted basis functions of the decomposition. As a result, the length of the approximated vector is less than the length of the original vector. The radio-frequency pulse is determined as a function of the approximated vector. This method can be used to determine a multichannel RF pulse.

14 Claims, 8 Drawing Sheets

(51) Int. Cl.
*G01R 33/44* (2006.01)
*G01R 33/48* (2006.01)
*G01R 33/483* (2006.01)
G01R 33/24 (2006.01)
G01R 33/56 (2006.01)
G01R 33/561 (2006.01)

(56) References Cited

U.S. PATENT DOCUMENTS

| | | | | |
|---|---|---|---|---|
| 5,361,763 A * | 11/1994 | Kao | | G01R 33/56 |
| | | | | 382/145 |
| 5,490,516 A * | 2/1996 | Hutson | | G01S 3/802 |
| | | | | 128/901 |
| 5,662,109 A * | 9/1997 | Hutson | | A61B 6/502 |
| | | | | 600/411 |
| 5,821,752 A | 10/1998 | LeRoux | | |
| 7,375,523 B1 * | 5/2008 | Hancu | | G01R 33/10 |
| | | | | 324/307 |
| 7,493,225 B2 * | 2/2009 | Wang | | G06K 9/00496 |
| | | | | 702/85 |
| 7,916,909 B2 * | 3/2011 | Khazen | | G06T 7/0016 |
| | | | | 382/128 |
| 9,767,549 B2 * | 9/2017 | Ishikawa | | G06T 7/0012 |
| 2010/0066362 A1 | 3/2010 | Ullmann | | |
| 2011/0044521 A1 | 2/2011 | Tewfik et al. | | |
| 2011/0241680 A1 | 10/2011 | Mossnang et al. | | |
| 2012/0286778 A1 | 11/2012 | Diehl et al. | | |
| 2013/0285660 A1 | 10/2013 | Ritter | | |

OTHER PUBLICATIONS

Mallat, et al. "Matching Pursuits with Time-Frequency Dictionaries", in: IEEE Transactions on Signal Processing, vol. 41, No. 12; pp. 3397-3415 (1993).

Feng et al.: "An Algorithm for Fast Parallel Excitation Pulse Design", in: Proc. Intl. Soc. Mag. Reson. Med., vol. 21, p. 4255 (2003).

Davis et al. "Adaptive Time-Frequency Approximations with Matching Pursuits", in: Courant Institute of Mathematical Sciences, pp. 1-27 (1998).

Akansu et al. "Multiresolution Signal Decomposition", 2nd Ed. pp. 1-499, (2002).

* cited by examiner

METHOD AND MAGNETIC RESONANCE APPARATUS FOR DETERMINATION OF RADIO-FREQUENCY PULSES

BACKGROUND OF THE INVENTION

1. Field of the Invention

The invention concerns techniques for determining a radio-frequency pulse, for example a multichannel radio-frequency pulse, for magnetic resonance imaging. In particular, the invention relates to techniques of the type wherein an approximation is made of a vector that represents a spatial region in which transverse magnetization is to be influenced by the radio-frequency pulse.

2. Description of the Prior Art

In magnetic resonance (MR) imaging, transverse magnetization of nuclear spins in an examination subject is influenced, i.e. excited or refocused, by the irradiation or transmission of a radio-frequency (RF) pulse. Excitation of the transverse magnetization typically means deflection of the nuclear spins from their equilibrium position along the longitudinal direction, which can be defined, for example, by the basic magnetic field (B0 field) and locally acting perturbation fields that occur due to susceptibility changes. Usually, large-area whole body transmitting coils, for example, are used for radiating the RF pulses. Such whole-body coils have dimensions on the order of magnitude of the actual object under examination. The RF magnetic field (B1 field) generated by the transmission is then substantially constant or homogeneous along the object under examination.

However, it is also possible to use multiple RF transmitting coils in a coil array that have comparatively small dimensions. Time-parallel transmission of the identical, individual RF pulses via the different transmitting coils enables a spatially-selective influence on the transverse magnetization. Here, the transverse magnetization can be influenced in a well-defined, specified spatial region by specific data entry points in the spatial frequency domain (k-space) being passed through (traversed) during the transmission, i.e. along a specific k-space trajectory.

Recently, it has also been possible in this regard to use so-called multichannel RF pulses within the context of parallel transmission (pTX). To this end, typically individual, different RF pulses, that combine to form the multichannel RF pulse, are transmitted by the different RF transmitting coils of the coil array. A multichannel RF pulse can make it possible to generate different time-dependent B1 fields that are well-defined with respect to phase or amplitude, at different spatial positions in the object under examination. pTX enables the sampling requirement of the Nyquist theorem to be broken (not satisfied) and the necessary scanning of (entry of MR data into) the k-spaces, and hence also the duration of the multichannel RF pulse, to be significantly reduced, by a degree that is called TX acceleration.

In addition, pTX techniques have advantages in connection with high-field MR systems with which the basic magnetic field has a high field strength, for example 3 tesla or 5 tesla or more. In such cases, the specific absorption rate (SAR) of the RF exposure for the patient can be reduced by the use of multichannel RF pulses. It is also possible to compensate inhomogeneities of the B1 field more effectively.

However, known techniques of this kind can also be associated with certain restrictions and disadvantages. For example, it can typically be necessary to determine the individual RF pulses, i.e. a temporal sequence of the voltage signal applied to different RF transmitting coils of the coil array, of which the multichannel RF pulse is composed, shortly before the performance of MR imaging, for example as a function of different measured and/or preset operating parameters of the MR system, in particular already in the presence of the object under examination in the MR system. To this end, it is possible, for example, to solve an equation corresponding to equation (3) in DE 10 2012 207 132 B3. However, this can require a high computing capacity. For example, depending upon the desired spatial resolution and/or temporal resolution of the RF pulse to be determined, it may be necessary to handle a data volume in the order of magnitude of gigabytes. Typically, it can be necessary to invert a system matrix or design matrix of this order of magnitude which reflects the operating parameters etc. in order to invert a linear equation system.

In this context, it is known to use a wide variety of digital-signal-processing or linear-algebra techniques to reduce the amount of computational effort required. It is often the case, however, that techniques of this kind are not able to reduce the required computational effort significantly and/or represent a comparatively strong approximation of the problem, which can result in undesirably high inaccuracies or errors in the solution.

For example, techniques are known from S. Feng and J. X. Ji, "An Algorithm for Fast Parallel Excitation pulses Design" in Proc. Intl. Soc. Mag. Reson. Med 21 (2013) 4255 relating to more extensive simplifying assumptions when determining multichannel RF pulses. For example, it is known from this article by Feng et al. to limit the size of entries of a system matrix in that contributions are rejected if they only make a small energy contribution to the solution. In this case, for example, spatial frequencies with a low contribution to the spatial region to be excited, which are regularly the higher spatial frequencies, are rejected. As a result, it is in turn possible to reduce the dimensions of the system matrix to be inverted. However, this typically results in a restriction of the accuracy to be achieved since finer details in the multichannel RF pulse are not taken into account or only restrictedly taken into account thus causing the spatial region actually excited to be smeared or blurred. The reason is that typically contributions contributing to high spatial frequencies are not taken into account.

For example, techniques are known from DE 10 2011 005 174 A1 that also relate to simplifying assumptions when determining multichannel RF pulses. For example, the format of the result vector representing the temporal course of the multichannel RF pulse can be restricted in that it is determined as a linear combination of precompiled basis functions of a decomposition. As a result, it is in turn possible to reduce the dimensions of the system matrix to be inverted, in particular the number of its columns. However, the result is a restriction of the achievable accuracy since the degrees of freedom with respect to which the result vector is optimized are restricted. For example, the compensation of B1 field inhomogeneities and/or B0 field inhomogeneities on the determination of a multichannel RF pulse cannot be considered or only considered to a limited extent, which can result in significant artifacts and quality losses in the excited spatial region.

Therefore, there is a need for improved techniques for the determination of RF pulses, in particular for improved pTx techniques. In particular, there is a need for techniques that permit a relatively low computationally intensive determination of the RF pulses. There is also a need for techniques that allow a relatively precise and flexible determination of the RF pulses.

SUMMARY OF THE INVENTION

An object of the present invention is to provide a magnetic resonance apparatus and a method for operation thereof that address the aforementioned needs.

The objects are achieved in accordance with the invention by a method for determining RF pulses for multiple RF transmitting coils of a coil array in an MR system wherein transmission of the RF pulses via the multiple of RF transmitting coils influences the transverse magnetization of nuclear spins in an object under examination in a specified spatial region. The method includes reception, as an input into a computer, of operating parameters of the MR system. The method further includes, in the computer, depiction of the spatial region as a vector and the approximation of the vector by decomposition into a finite number of weighted basis functions of the decomposition thus causing the length of the approximated vector to be less than the length of the original vector. The method further includes determination of the RF pulse as a function of the operating parameters of the MR system and of the approximated vector.

For example, the RF pulse can be a multichannel RF pulse, i.e. it can be composed of different individual RF pulses for the multiple RF transmitting coils. It is also possible to transmit the same RF pulse via the different RF transmitting coils of the coil array of the MR system. In the latter case, the pulse duration can be relatively long. In both cases it is possible to influence the transverse magnetization spatially-selectively in the specified spatial region.

The spatial region can have, for example, finite dimensions along at least two spatial directions. For example, the spatial region can define an examination volume of the object under examination; that is a spatial region from which MR data is to be acquired. By a selective phase relation of the individual RF pulses at the different RF transmitting coils at specific locations, time-parallel transmission of the RF pulse can give the spatial region finite dimensions, i.e. no significant influence on the transverse magnetization takes place outside the spatial region.

For example, the coil array can consist of two or four or twelve RF transmitting coils. The RF transmitting coils can have geometric dimensions in the order of magnitude of the spatial region. The RF coils can also be larger or smaller than the spatial region. In particular, the RF transmitting coils can have dimensions that are lower than the dimensions of the object under examination. The RF transmitting coils can, for example, be arranged at least partially symmetrically in relation to or around the spatial region. The RF pulse can be made up of a corresponding number of individual RF pulses, for example one RF pulse for each RF transmitting coil. The RF pulses can be characterized by a temporal course of an electric voltage and/or current to applied to the individual RF transmitting coils; alternatively or additionally, the RF pulses can be characterized by the time-place dependence of the B1 fields generated. Time-parallel transmission can mean: at least partially temporally overlapping finite amplitudes of the electric voltages/currents.

The spatial region (the environment of the spatial region) can therefore designate the locations in which a (no) finite influence on the transverse magnetization takes place. It is also possible for the transverse magnetization to be influenced to different degrees at different locations within the spatial region, i.e. for example more or less of the transverse magnetization is deflected from their equilibrium position that is excited with larger or smaller flip angles. It is also possible for the transverse magnetization to be influenced homogeneously within the spatial region. Depending upon the matter in question, the vector can consist, for example, only of zero values, i.e. no influence on the transverse magnetization at the corresponding location, and one, i.e. influence on the transverse magnetization at the corresponding location. It is also possible for the vector to have different finite values in order to describe the degree of the influence.

The vector can be defined or structured in diverse ways. For example, the vector can have different samples or scanning points in the apparatus coordinate system of the MR system in a sequential, specified sequence.

The basis functions of the decomposition can also be described as atoms or dictionary elements of a dictionary or wavelets. The basis functions of the decomposition thus can describe a set of functions, in which the decomposition takes place. The basis functions of the decomposition thus can be used during the decomposition to depict the vector particularly efficiently, i.e. with little information, but still accurately. During the decomposition, weights of the weighted basis functions can describe the coefficients of the individual basis functions with which the individual basis functions contribute to the description of the vector. In different embodiments, the basis functions of the decomposition can meet requirements that are usually placed on a mathematical basis of a vector space, i.e., for example, orthogonality to one another. However, it is also possible for the basis functions of the decomposition not to depict any basis functions of a corresponding vector space, i.e., for example, not to be orthogonal to one another; this could, for example, in particular be the case in connection with so-called matching pursuit decomposition algorithms. In other words, it is not necessary for the basis functions of the decomposition to meet the strict mathematical definition of a basis of a vector space.

For example, the method can further comprise: transmission of the RF pulse through the coil array to influence the transverse magnetization in a specified spatial region. Insofar, the method can further comprise: controlling a gradient system of the MR system for switching gradients during the time-parallel transmission. The transmission of the RF pulse can be a time-parallel transmission of the individual RF pulses that form the RF pulse respectively via an RF transmitting coil of the coil array.

Therefore, the approximation of the vector can achieve a reduction in the length of the original vector. In other words, the spatial region can be depicted in a simplified manner. This can mean that the approximated vector does not describe the original specified spatial region exactly, but with a certain deviation or a certain error. Here, it is possible—for example in deviation from the aforementioned publication—for the error to occur in other variables than in the resolution or sharpness of the MR image obtained. Simultaneously, however, the shortened length of the approximated vector can result in the determination of the RF pulse being less computationally intensive since a smaller amount of data has to be handled or taken into account.

This can be relevant in a situation in which a person to be examined is already arranged in the MR system at the time of the determination of the RF pulse. Then, for reasons of patient comfort and/or loading on the MR system, it can be desirable to start the actual MR measurement speedily. The more computationally intensive the determination of the RF pulse, the longer such starting is delayed.

Typically, the more accurately the vector is approximated, the more accurately, i.e. with higher quality, the specific RF pulse of this kind can influence the transverse magnetization in the specified spatial region. Inaccuracies in the influence of the spatial region can be, for example: deviations from the desired amplitude of the influence in and/or on the edge of the spatial region; and/or deviations from the shape of the specified spatial region; and/or finite amplitudes of the influence on the transverse magnetization even outside the specified spatial region.

The method can further include determination of the number of weighted basis functions as a function of a specified criterion which describes an accuracy of the approximation and/or a quality of influence on the transverse magnetization in the specified spatial region by the time-parallel transmission of the specific RF pulse.

Generally, a larger (smaller) number of weighted basis functions achieves a higher (lower) accuracy of the approximation.

The determination of the number as a function of the criterion enables, for example based on the specific situation in question, i.e. as a function of the specific MR system and/or of the specific object under examination, an appropriate balance to be struck between the quality of the influence on the transverse magnetization in the specified spatial region, and the degree of the approximation or the required computing capacity.

Generally, the most diverse of decomposition algorithms can be used for the approximation. For example, the weighted basis functions of the decomposition can be determined by means of a matching pursuit algorithm, see in this regard S. G. Mallat and Z. Zhang, Matching Pursuits with Time-Frequency Dictionaries, IEEE Trans. on Sign. Proc., (1993) 3397-3415. It would also possible for the weighted basis functions of the decomposition to be determined by a wavelet decomposition algorithm, see in this regard A. N. Akansu and R. A. Haddad, Multiresolution Signal Decomposition: Transforms, Subbands, and Wavelets (1992) Boston, Mass. In such cases, the approximated vector can be sparse.

In conformity with its general mathematical sense, "sparse" means, in the case of vectors or matrices with n×n entries, a number of entries of the order of magnitude n log(n), or fewer, which have values unequal to zero.

Those skilled in the art are aware of diverse techniques in connection with the handling of sparse vectors and matrices that enable the required computing resources to be reduced. This can have the result that the determination of the RF pulse can be performed with particular low computing outlay.

Decomposition into the basis functions of the decomposition can be implemented by obtaining the unweighted basis functions from a set of basis functions of a decomposition algorithm and assignment of weights to the basis functions obtained. For example, the, optionally parameterized, stored basis functions and/or their weights can be stored in a matrix. For example, each entry in the matrix can describe the contribution of a specific basis function to a specific element of the vector.

The weights of the weighted basis functions can either be stored in the matrix of the basis functions or stored in the approximated vector. The weights of the weighted basis functions can also be randomly distributed between the matrix of the basis functions and the approximated vector. In other words, therefore, the coefficients of the different basis functions can be stored in the matrix or the vector.

While the same facts can be depicted in different mathematical ways, simultaneously, advantages in the required computing capacity can be obtained during the determination of the RF pulse depending on the mathematical depiction.

The specified criterion can be selected, for example, from the group of the number of basis functions, and an error in the approximation of the vector that is described by the ratio of the approximated vector to the original vector. For example, the user can specify that the vector should be described a specific number of basis functions of the decomposition. It would also possible, for example within the context of an iterative check, for in each case the error in the approximation of the vector to be determined, for example until the error falls below a specific threshold value. In this context, in each iteration, one or more further basis functions of the decomposition can be used for the approximation of the vector. In particular, it can be possible to perform the determination of the error of the approximation before the actual determination of the RF pulse so that, before this typically particularly computationally intensive step, it is optionally possible to make another change for the approximation.

The basis functions can be parameterized functions selected from the following list of function types: Haar, Symlets, Meyer, Daubechies, Coiflets, Gabor, Fermi. Those skilled in the art are aware of diverse further function types that can also be used. Corresponding function types are in principle known to those skilled in the art so that further details need not be explained herein. It would, for example, in particular in the connection with the matching pursuit decomposition algorithm, be possible for the basis functions of the decomposition to comprise different examples of the above-mentioned function types. This can make it possible to achieve a particularly low error in the approximation of the vector.

Generally, diverse techniques are known for determining the RF pulse, in particular multichannel RF pulses, for example with reference to the technique in the article by S. Feng and J. I. Xi mentioned in the introduction. A further technique is, for example, known from W. Grissom et al., Spatial Domain Method for the Design of RF Pulses in Multicoil Parallel Excitation in Magn. Reson. Med. (2006) 620-629. Such techniques can, for example, be combined with the above-described approximated vector. Here—due to the reduced length of the vector—it is possible to achieve a reduction of the required computing capacities.

The method can further include approximation of a system matrix, which contains the operating parameters, by decomposition into a finite number of further basis functions. As a result, it can be achieved that the dimension of the approximated system matrix is less than the dimension of the original system matrix. The further basis functions can correspond to a pseudo-inversion matrix of a matrix of the basis functions. The determination of the RF pulse can be performed as a function of the approximated system matrix.

For example, the system matrix can be determined according to equation (4) from the aforementioned article by W. Grissom. The operating parameters can be selected, for example, from the group of a k-space trajectory along which the k-space is scanned during the transmission of the RF pulse, a measured B0 field map, and/or a measured B1 field map. For example, the determination of the RF pulse can further include numerical solution of a linear equation system in which the approximated system matrix links a solution vector, which describes the RF pulse, with the spatial region depicted as an approximated vector.

Typically, it can be necessary within the context of the determination of the RF pulse to resolve a linear equation system of this kind by inverting the system matrix or the approximated system matrix, i.e. to determine an inversion matrix or pseudo-inversion. Typically the required computing capacity scales in a super-proportional manner to the number of elements of the matrix to be inverted. Therefore, it can be possible to save significant computing capacity by determining the approximated system matrix with a reduced dimension.

Generally, within the context of the approximation of the system matrix, corresponding techniques can be applied as described above with reference to the approximation of the vector. It is possible, for example, for the further basis functions of the decomposition of the system matrix for example to be determined independently of the basis functions of the decomposition of the vector. It is also possible for the further basis functions of the decomposition of the system matrix to be determined from the basis functions of the decomposition of the vector. For example, the approximation of the system matrix can comprise: determination of the pseudo-inversion matrix of the matrix of the basis functions and application of the pseudo-inversion matrix to the system matrix. As a result, the system matrix can be sparse. As a result, a number of columns of the approximated system matrix can be equal to a number of columns of the original system matrix and a number of rows of the approximated system matrix can be less than a number of rows of the original system matrix. The pseudo-inversion matrix can also be described as a generalized inversion matrix for non-quadratic matrices.

As described above, this can achieve the effect of reduced computing capacity to be deployed during the inversion of the system matrix within the context of the determination of the RF pulse. The selective reduction of the dimension of the matrix along the rows of the approximated system matrix but not, however, along the columns can result in degrees of freedom in the determination of the solution vector not being reduced in comparison to the non-approximated system matrix—for example in comparison with the aforementioned technique according to DE 10 2011 005 174 A1. In other words, on the determination of the RF pulse, despite the approximation of the system matrix, all original degrees of freedom which are proportional to the number of columns of the system matrix or to the length of a solution vector can be available. As a result, it can be achieved that the RF pulse can be determined with a particularly high accuracy or the quality of the influence on the transverse magnetization in the specified spatial region is particularly high.

The numerical solution can further include the application of at least one of the techniques from the group of LU decomposition of the approximated system matrix, ILU decomposition of the approximated system matrix, Cholesky decomposition of the approximated system matrix, iterative solving techniques, and parallel computational techniques. The iterative solving techniques can include, for example, so-called projection-techniques, separation techniques or GMRES approaches. Techniques of this kind—which can be performed additionally to the above-described inventive techniques for the approximation of the vector and optionally the system matrix—can further reduce the required computing capacity. For example, it is possible to reduce the computing capacity particularly greatly by means of such techniques if the system matrix is depicted as sparse, for example due to the decomposition into the further basis functions.

The invention also concerns an MR system designed to determine a multichannel radio-frequency pulse for multiple radio-frequency transmitting coils of a coil array of the MR system. The transmission of the RF pulse via the multiple RF transmitting coils influences the transverse magnetization of an object under examination in a specified spatial region. The MR system has a computer designed (programmed) to perform the steps of reception of operating parameters of the MR system, depiction of the spatial region as a vector, and approximation of the vector by decomposition into a finite number of weighted basis functions of the decomposition thus causing the length of the approximated vector to be less than the length of the original vector, and determination of the RF pulse as a function of the operating parameters of the MR system and the approximated vector. For example, the RF pulse can be a multichannel RF pulse.

The MR system can further include the coil array. The RF transmitting coils of the coil array can be designed to transmit the specific RF pulse.

The MR system according to the invention can be designed to perform the above-described method for determining a RF pulse.

The MR system according to the invention achieves advantages corresponding to those achieved with the method according to the invention.

DESCRIPTION OF THE PREFERRED EMBODIMENTS

In the following, the present invention is described in more detail with reference to preferred embodiments with reference to the drawing. In the figures, the same reference numbers designate the same or similar elements. The figures are schematic representations of different embodiments of the invention. Elements shown in the figures are not necessarily depicted true to scale. Rather, the different elements shown in the figures are reproduced such that their function and general purpose will be comprehensible to the person skilled in the art. Connections and couplings depicted in the figures between functional units and elements can also be implemented as indirect connections of couplings. A connection or coupling can be implemented as wire-bound or wireless. Functional units can be implemented as hardware, software or a combination of hardware and software.

The following will discuss techniques allowing the determination of an RF pulse, in particular a multichannel RF pulse, while using comparatively low computing capacity. The multichannel RF pulse can consist of different individual RF pulses transmitted by RF transmitting coils. Such techniques for determining a multichannel RF pulse are also known to the person skilled in the art by the term parallel RF pulse design in connection with pTx techniques. The present techniques are particular characterized in that a dimension of the system matrix to be inverted of the underlying linear equation system can be reduced such that the degrees of freedom of the solution vector, i.e. the length of the solution vector, are not reduced. As a result, on the one hand, a high quality of the influence on the transverse magnetization in a specified spatial region can be achieved—simultaneously, the required computing capacity can be comparatively low.

This is achieved by the decomposition of the vector depicting the spatial region into weighted basis functions. To this end, it is possible, for example, to use a matching pursuit decomposition algorithm or a wavelet decomposition algorithm. The decomposition causes the vector approximated in this way to have a shorter length, which saves computing capacity. These weighted basis functions can then be further used to obtain a sparse and reduced-size depiction of the system matrix, which saves further computing capacity. This can, for example, take place by inverting the matrix of the basis functions and applying of the inverted matrix of the basis functions to the system matrix. The sparse system matrix permits a particularly low computationally intensive inverting of the same during the determination of the multichannel RF pulse or of the corresponding solution vector.

Typically, the linear equation system or optimization problem to solve has the following form $$b = \text{argmin}_b (\|m - Ab\|), \quad (1)$$

wherein, here b describes the solution vector, m the vector, which describes the spatial region and A the system matrix. To solve equation 1, it may be necessary to invert the system matrix. See also equation 5 in the aforementioned publication by W. Grissom et al., and equation 3 in the patent DE 10 2012 207 132 B3.

The vector b can be expressed as decomposition, i.e.

$$m = BF \cdot m_{compressed}, \quad (2)$$

wherein $m_{compressed}$ is the approximated vector and BF the matrix of the basis functions.

In the context of these techniques it can be valuable to take into account more or less basis functions in the decomposition of the vector, i.e. a longer or shorter approximated vector $m_{compressed}$. In a simple embodiment, it is possible to specify the number of basis functions to be used. However, it would also be possible for, for example, within the context of an iterative method, to add a basis function in each case, i.e. the approximation becomes more accurate until a specific threshold value is fallen below. In this respect, it is possible, for example, to observe a deviation of the approximated vector compared to the original vector and/or a deviation of the approximated system matrix compared to the original system matrix.

Figure 1:
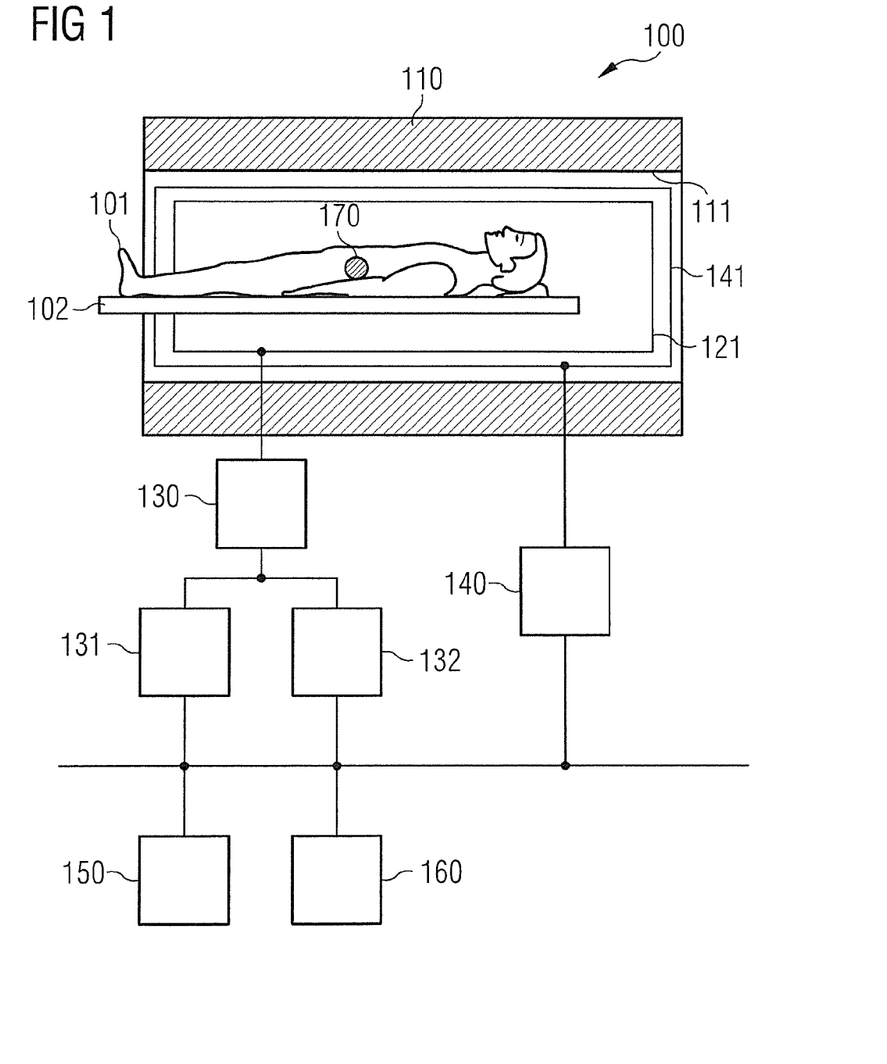
FIG. 1 is a schematic illustration of an MR system.

FIG. 1 depicts an MR system 100, which is set up to perform the corresponding inventive techniques, methods and steps. The MR system 100 comprises a magnet 110 which defines a tube 111. The magnet 110 can generate a basic magnetic field parallel to its longitudinal axis. The basic magnetic field can have inhomogeneities, which are local deviations from a reference value. These are, for example, depicted in a B0 field map. An object under examination, here a person to be examined 101, can be pushed into the magnet 110 on a table 102. The MR system 100 further comprises a gradient system 140 for generating gradient fields, which are used for MR imaging and for the spatial encoding of the raw data acquired. Typically, the gradient system 140 comprises at least three separately controllable gradient coils 141 that are well-defined with respect to one another. The gradient coils 141 make it possible to apply and switch gradient fields, along certain spatial directions (gradient axes). The switching of the gradient fields can give rise to eddy current effects which cause local magnetic fields. The gradient fields can be used, for example, for slice selection, to the frequency encoding (in the read direction) and for phase encoding. This enables spatial encoding of the raw data to be achieved. The spatial directions, which are in each case parallel to layer-selection gradient fields, phase-encoding gradient fields and read-out gradient fields, do not necessarily have to be coincident with the machine coordinate system. Instead, they can be defined with reference to a k-space trajectory, for example, which in turn can be defined on the basis of specific requirements for the respective MR measuring sequence can and/or anatomical properties of the person to be examined 101.

For the excitation of the polarization or alignment of the nuclear spins or magnetization in the longitudinal direction in the basic magnetic field, a coil array 121 is provided, which can irradiate an amplitude-modulated RF pulse into the person to be examined 101. The coil array 121 can optionally also transmit a multichannel RF pulse. As a result, a transverse magnetization can be generated or influenced. For the generation of such RF pulses, an RF transmit unit 131 can be connected via an RF switch 130 to the coil array 121. The RF transmit unit 131 can include an RF generator and an RF amplitude-modulation unit. The RF excitation pulses can flip (deflect) the transverse magnetization 1D slice-selectively or 2D/3D spatially-selectively in a specified spatial region 170 or even globally out of steady state.

Further, an RF receiver unit 132 is coupled via the RF switch 130 to the coil array 121. The RF receiver unit 132 can acquire MR signals from relaxing transverse magnetization, for example by inductive coupling into the coil array 121, as MR data. It is generally possible to use separate coil arrays 121 for the irradiation of the RF excitation pulses by means of the RF transmit unit 131 and for the acquisition of the MR data by means of the RF receiver unit 132.

The MR system 100 further has a control computer 150, which can, for example, have a screen, a keyboard, a mouse etc. The control computer 150 can be used to acquire a user input and implement an output to the user. For example, it can be possible to use the control unit 150 to set individual operating modes or operating parameters of the MR system by the user and/or automatically and/or remotely.

The MR system 100 further has a computer 160. The computer 160 can be designed (programmed) to perform diverse computing operations within the context of the determination of the multichannel RF pulse. To this end, the computer 160 can perform matrix and vector operations and/or solve linear equation systems and/or apply decomposition algorithms.

Figure 2:
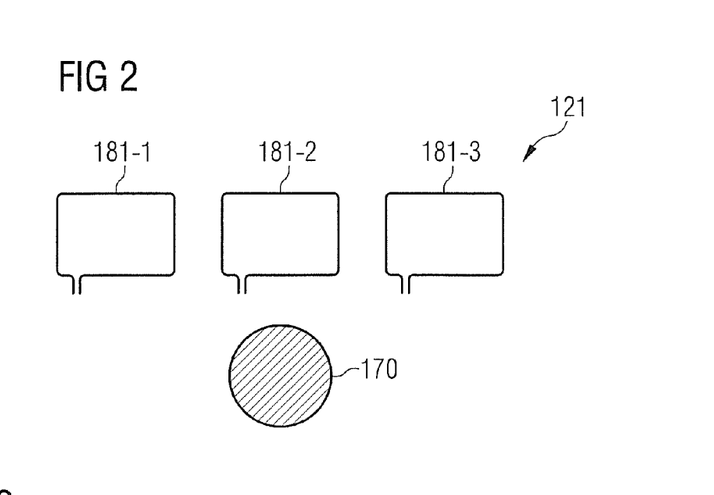
FIG. 2 illustrates a coil array of the MR system with three RF transmitting coils and a spatial region in which transverse magnetization is to be influenced.

FIG. 2 illustrates the coil array 121 of the MR system 100. In this example, the coil array 121 has three RF transmitting coils 181-1, 181-2, 181-3, but can have more or fewer RF transmitting coils 181-1, 181-2, 181-3. As is evident from FIG. 2, the dimensions of RF transmitting coils 181-1, 181-2, 181-3 are in the order of magnitude of the specified spatial region 170. As a result, it is possible for the B1 fields generated by the coils to have a significant spatial dependence along the specified spatial region 170. As a result, it is possible, by transmission of the multichannel RF pulse, selectively to influence the transverse magnetization in the spatial region 170. This can be achieved by positive and negative interference of B1 fields of the individual RF pulses transmitted by the individual RF transmitting coils 181-1, 181-2, 181-3.

Figure 3:
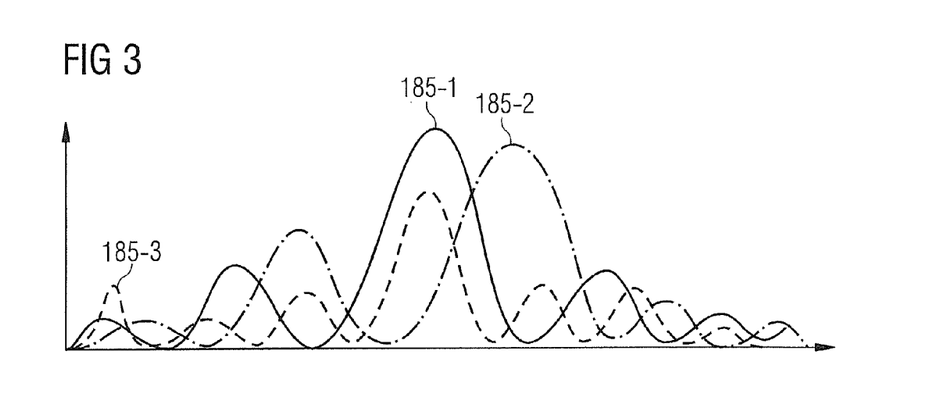
FIG. 3 illustrates individual RF pulses of a multichannel RF pulse which is to be transmitted through the coil array.

FIG. 3 depicts time characteristics of the individual RF pulses 185-1, 185-2, 185-3, which combine to form the multichannel RF pulse 188. For example, FIG. 3 can describe the B1 field of the different RF pulses 185-1, 185-2, 185-3 at a specific location. It would also be possible for FIG. 3 to describe a voltage characteristic of voltage at the different RF transmitting coils 181-1, 181-2, 181-3. Insofar, the qualitative shape of these parameters can be comparable. Time-parallel transmission of these individual RF pulses 185-1, 185-2, 185-3 or transmission of the multichannel RF pulse 188 defined in this way can influence the transverse magnetization in the specified spatial region 170.

Figure 4:
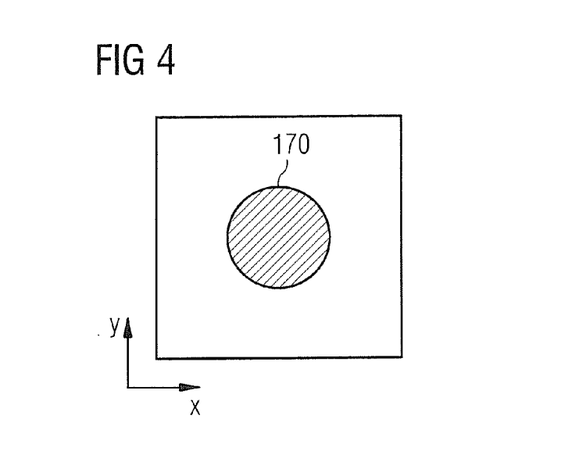
FIG. 4 illustrates the specified spatial region.

FIG. 4 illustrates the specified spatial region 170 in a finite environment. For example, the finite environment can be discretized by different voxels in which the excitation takes place. The voxels can also be called samples. For example, the samples could be sequentially numbered line-by-line and in each case correspond to entries in a corresponding vector. In the case of homogeneous excitation selectively within the spatial region 170, the entries of this vector corresponding to samples inside (outside) the spatial region 170 could have values equal to one (values equal to zero).

Figure 5:
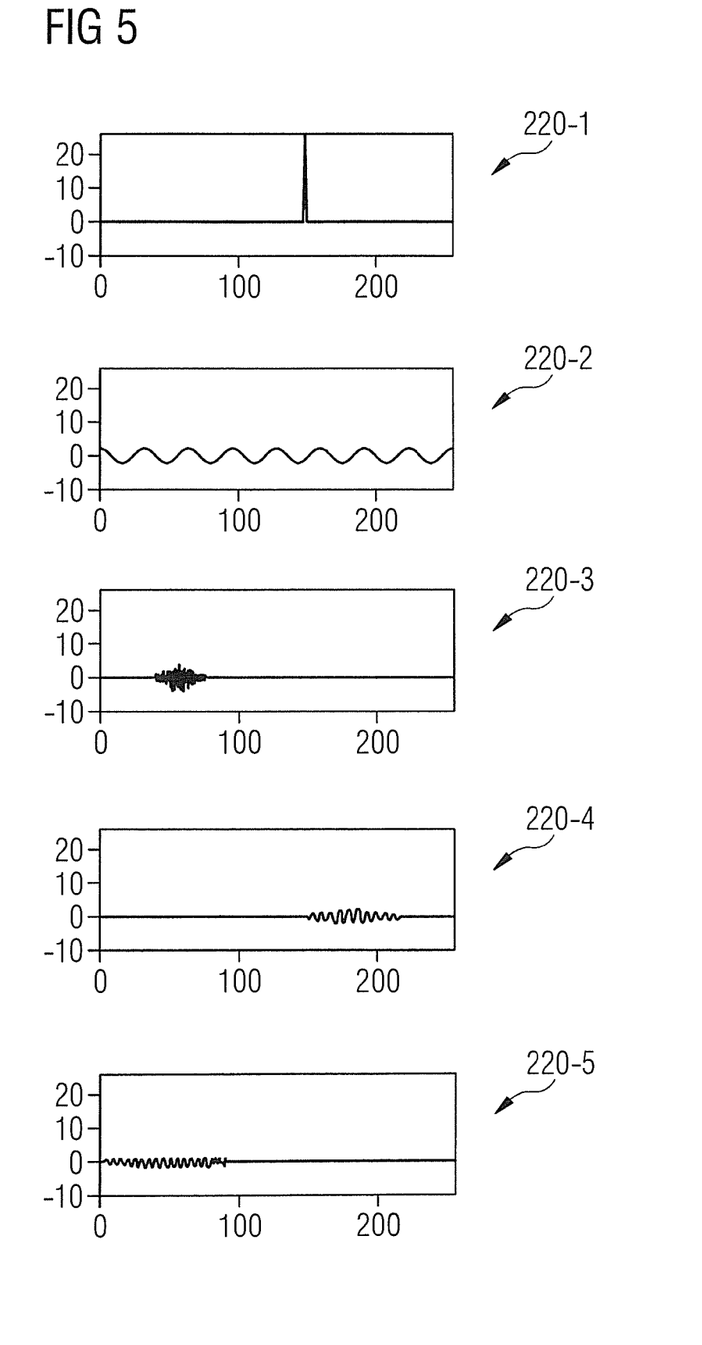
FIG. 5 illustrates basis functions of a decomposition of a vector depicting the specified spatial region.

In this case, this vector, which describes the spatial region 170, can be approximated by basis functions of a decomposition. FIG. 5 depicts such basis functions 220-1-220-5. It is possible to use a wide variety of function types—including mixed —, for example Haar, Symlets, Meyer, Daubechies, Coiflets and/or Gabor-functions.

Figure 6:
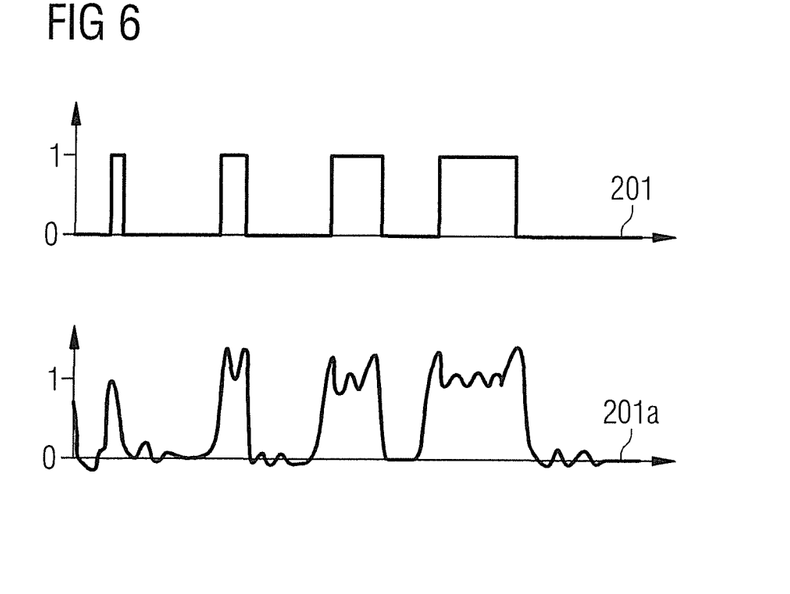
FIG. 6 illustrates the vector and an approximated vector obtained by decomposition into the basis functions.

The top of FIG. 6 depicts sections of the original vector 201, which describes the spatial region 170. As described above, individual points along the vector 201 (in FIG. 6 plotted horizontally) correspond to the different samples, which are arranged line-by-line inside the finite environment (cf. FIG. 4). Inside the spatial region 170, the entries of the vector have values equal to one, but they could also have other finite values.

The bottom of FIG. 6 illustrates the spatial region 170 corresponding to the section in the top of FIG. 6 depicted by the approximated vector 201a, which is obtained by decomposition into the basis functions 220-1-220-5. The approximated vector 201a has only five entries (not evident in FIG. 6) corresponding to five basis functions 220-1-220-5. However the same number of samples is described with a reduced data basis. It is evident from a comparison of the vector 201 with the approximated vector 201a that the spatial region is described by the approximated vector 201a with a certain inaccuracy or in a faulty manner. This is the result of the reduction in the length of the approximated vector 201a. Namely, locally the values of the approximated vector 201a deviate from the values of the original vector 201. For example, one type of deviation or one characteristic of the deviation can depend upon the specific basis functions of the decomposition used for the approximation; i.e., for example, in particular upon the so-called dictionary used, which helps to determine the function types as a class of basis functions of the decomposition. In the example in FIG. 6, the deviation can, for example, be characterized by using Gabor basis functions of the decomposition by overshooting/undershooting at each of the edges of the spatial region 170.

Figure 7:
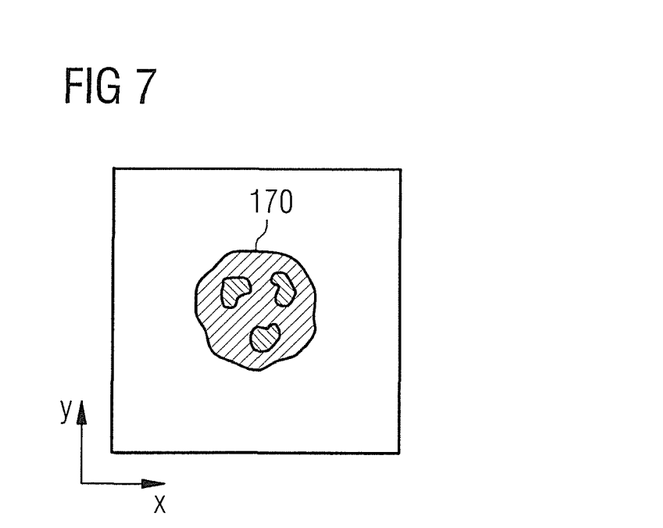
FIG. 7 illustrates the spatial region described by the approximated vector or obtained by transmission of the multichannel RF pulse, which was determined as a function of the approximated vector.

This error in the approximated vector 201a has an impact on the quality with which the transverse magnetization in the spatial region 170 is influenced by the specific multichannel RF pulse 188 determined on the basis of the approximated vector 201a. This is illustrated in FIG. 7 which depicts the spatial region 170a inside the environment. It is evident from a comparison of FIGS. 4 and 7 that certain deviations may occur between the specified spatial region 170 and the spatial region 170a actually influenced by the multichannel RF pulse 188 in the end, for example in the shape and/or amplitude of the spatial region 170. These deviations can be accepted to enable reduced computing capacity in the determination of the multichannel RF pulse 188.

Figure 8:
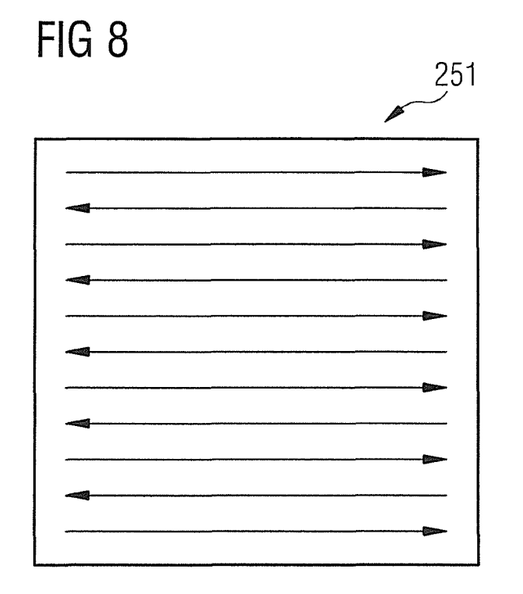
FIG. 8 illustrates a k-space trajectory, which defines as operating parameters of MR system as to how k-space should be scanned within the context of the transmission of the multichannel RF pulse.
Figure 9:
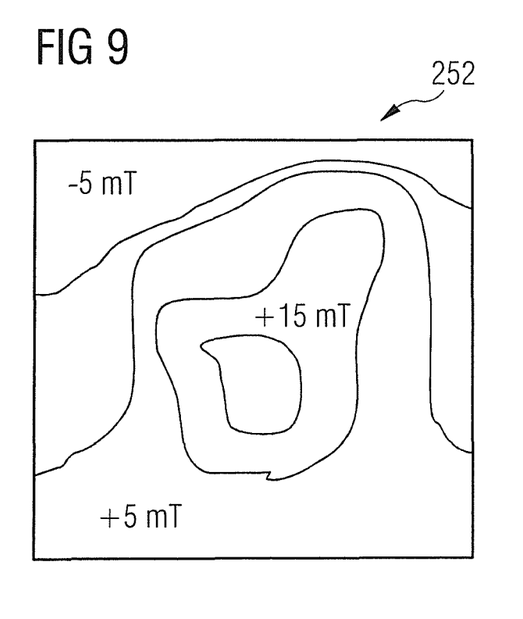
FIG. 9 illustrates a B0 field map corresponding to an operating parameter of the MR system.

To further reduce the computing capacity, it is also possible to approximate the system matrix. This can in turn take place by decomposition of the system matrix into a finite number of further basis functions. As a result, the dimension of the system matrix is reduced and the system matrix can be depicted as sparse. In particular, to solve the optimization problem defined according to equation 1, it can be advantageous to use an approximated system matrix with reduced dimensions. The system matrix can, for example, be defined by the k-space trajectory 251 (cf. FIG. 8) and/or a B0 field map 252 (cf. FIG. 9), which depicts inhomogeneities of the basic magnetic fields of the MR system 100. The system matrix can also be characterized by a B1 map of the individual RF channels.

The approximation can be performed, for example, with a completely new set of independent further basis functions. However, on the basis of equations 1 and 2, this can also, for example, take place on the basis of the basis functions BF of the approximated vector 201a $m_{compressed}$:

$$m = BF \cdot m_{compressed} = Ab \Rightarrow m_{compressed} = BF^{-1} \cdot Ab$$
$$\Rightarrow A_{compressed} = BF^{-1} A \quad (3)$$

In other words, the approximation of the system matrix can comprise: determination of the pseudo-inversion matrix $BF^{-1}$ of the matrix of the basis functions and application of the pseudo-inversion matrix $BF^{-1}$ to the system matrix A. As a result, the approximated system matrix $A_{compressed}$ is sparse and has a reduced number of rows compared to the original system matrix A. The numerical equation system in equation 1 can then be solved with the approximated system matrix $A_{compressed}$.

The following should also be noted with reference to the equations 2 and 3: In equation 2, it would be possible to store the weights of the weighted basis functions 220-1-220-5 either in the matrix BF or in the approximated vector $m_{compressed}$ 201a. It would also be possible to divide these weights element-by-element randomly between the matrix BF and the approximated vector $m_{compressed}$ 201a. Depending upon where the weights are stored, these have a different impacts on the approximated system matrix $A_{compressed}$. Here, it is established that it can be particularly advantageous to divide the weights randomly between the matrix BF and the approximated vector $m_{compressed}$ 201a.

The linear equation system to be solved is obtained on the basis of equation 1 taking into account equations 2 and 3:

$$b = \mathrm{argmin}_b(\|m_{compressed} - A_{compressed} b\|). \quad (4)$$

The reduced dimensions of $m_{compressed}$ and/or $A_{compressed}$ enable equation (4) to be solved with particularly low computational intensity.

It is also possible to use additional techniques known in principle to those skilled in the art, which are selected the from the group of LU decomposition of the approximated system matrix $A_{compressed}$ ILU decomposition of the approximated system matrix $A_{compressed}$, Cholesky decomposition of the approximated system matrix $A_{compressed}$, iterative solving techniques, parallel computational techniques.

Figure 10:
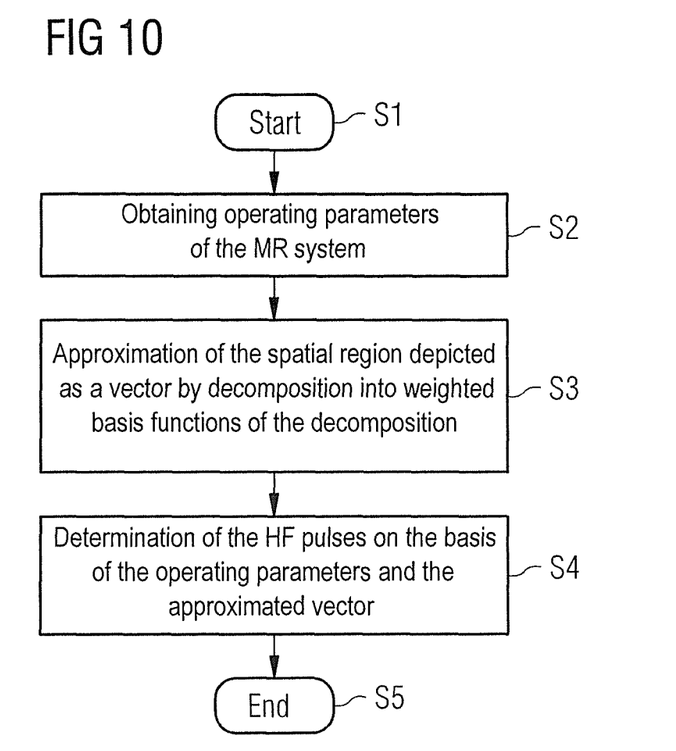
FIG. 10 is a flowchart of a method for determining a multichannel RF pulse according to different embodiments of the present invention.

FIG. 10 is a flowchart of a method for determining a multichannel RF pulse 188. The method starts with step S1. In step S2, the operating parameters 251, 252 of the MR system 100 are obtained. This can be used to determine the system matrix, for example using equation 4 in the publication of W. Grissom mentioned in the introduction. Then, in step S2 the approximation of the spatial region 170 shown as a vector 201 is performed thus causing the approximated vector 201a to be obtained. In step S4, the determination of the multichannel RF pulse 188 is performed on the basis of the operating parameters 251, 252, or on the basis of the system matrix and on the basis the approximated vector 201a. The method ends in step S5.

Figure 11:
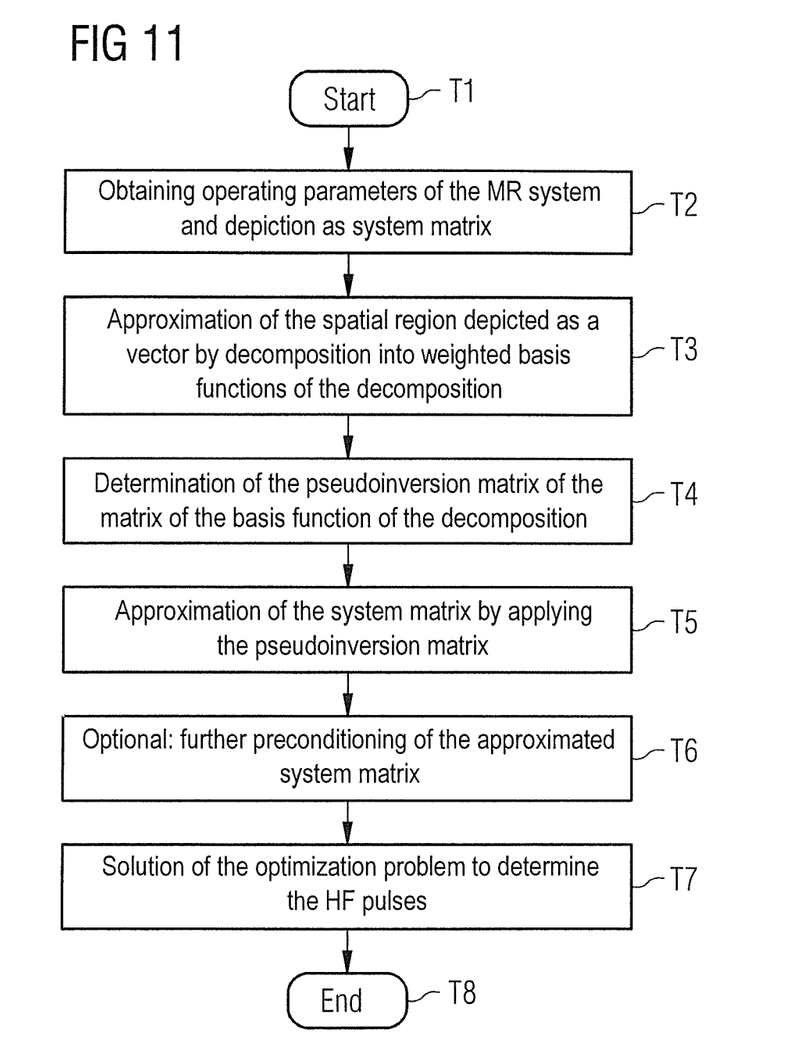
FIG. 11 is a flowchart of a method for determining a multichannel RF pulse according to different embodiments of the present invention.
Figure 12:
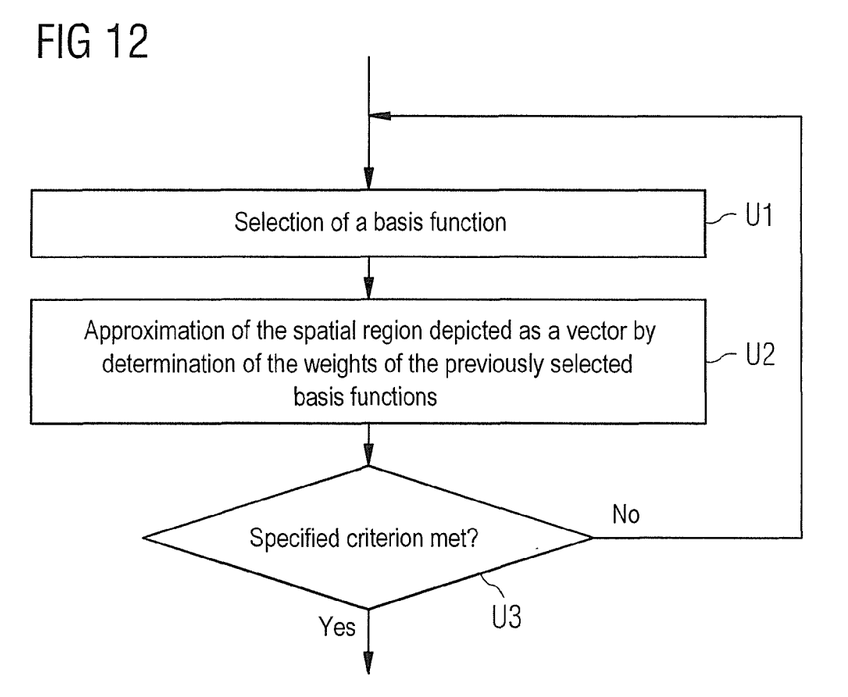
FIG. 12 is a flowchart illustrating details of the method shown in FIG. 11.

FIG. 11 is a flowchart representing a method for determining a multichannel RF pulse 188 according to further embodiments. Steps T1-T3 correspond to steps S1-S3 in FIG. 10. In step T4, the pseudo-inversion matrix of the matrix of the basis functions is compiled, following which the pseudo-inversion matrix is applied to the system matrix, see equation 3. As a result, the approximated system matrix is obtained, which is sparse. Then, in step T6 optionally the further preconditioning of the approximated system matrix can take place, for example within the context of an LU decomposition or similar techniques as described above in connection with equation 4. In step T7, the corresponding optimization problem for determining the multichannel RF pulse 188 is solved, see equation 4. The method ends in step T8.

Generally, the fewer the basis functions used for the description of the approximated vector 201a or the approximated system matrix, the greater the reduction in required computing capacity it is possible to achieve. For example, it is possible, for example, to determine the number of weighted basis functions 220-1-220-5 used as a function of a specified criterion, which describes an accuracy of the approximation and/or a quality of the influence on the transverse magnetization in the specified spatial region 170. The accuracy of the approximation can, for example, be expressed as:

$$\Sigma(m - BF \cdot m_{compressed})^2, \quad (5)$$

i.e. as the ratio of the approximated vector 201a to the original vector 201.

The ratio of the approximated system matrix to the original system matrix could also be considered as a further specified criterion:

$$\Sigma(A - BFA_{compressed})^2. \quad (6)$$

Other expressions are possible for a measure of the error, for example other measures of distance. The criteria in equations 5 and 6 can, for example, describe the quality with which, on the transmission of the multichannel RF pulse, the specified spatial region 170 is actually excited, i.e. the deviation of FIG. 7 from FIG. 4.

It would be possible, for example, to add further basis functions for the approximation of the vector 201 (step U1 in FIG. 11) until one of the criteria of the equations (5) or (6) reaches a specific threshold value (step U3 in FIG. 11). To this end, it can be necessary to perform the decomposition in each case with the cut set of basis functions (step U2) and possibly to calculated the approximated system matrix according to equation (4).

The features of the above-described embodiments and aspects of the invention can be combined with one another. In particular, the features can be used not only in the described combinations, but also in other combinations or on their own without leaving the field of the invention.

For example, the above mainly describes techniques for determining a multichannel RF pulse; however, corresponding techniques can also be used to determine an RF pulse consisting of identical individual RF pulses transmitted by the different RF transmitting coils of the coil array. For example, it can be possible for multi-dimensional spatially-selective excitation to do without multichannel RF pulse of this kind. It is namely also possible to achieve the spatial encoding by a specific k-space trajectory and switched gradients when using an RF pulse consisting of individual identical and equally weighted RF pulses. However, these identical, individual RF pulses typically have comparatively long pulse durations—in particular in comparison to multichannel RF pulses. In addition, such RF pulses can be particularly sensitive to susceptibility artifacts during the transmission and can prolong echo and refocusing time intervals.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a radio-frequency (RF) pulse for emission by a plurality of RF transmitting coils of a coil array of a magnetic resonance apparatus, wherein emission of said RF pulse by said plurality of RF transmitting coils influences a transverse magnetization of an object situated in the magnetic resonance apparatus, in a specified spatial region of the object, said method comprising:

providing a plurality of operating parameters of said magnetic resonance apparatus to a computer;

in said computer, representing said spatial region as an original vector and approximating said original vector, as an approximated vector, by decomposing said original vector into a finite number of weighted basis functions of a decomposition algorithm employed to decompose said original vector, to produce said approximated vector with a length that is less than a length of said original vector;

in said computer, determining said radio-frequency pulse as a function of said operating parameters and said approximated vector; and making the determined RF pulse available at an output of said computer in an electronic form allowing operation of said RF coils of said coil array to emit said RF pulse.

2. A method as claimed in claim 1 comprising in said computer, determining said finite number of weighted basis functions as a function of a criterion specified to said computer that describes at least one of am accuracy of the approximated vector to said original vector, and a quality of said influence of said transverse magnetization in the specified spatial region by time-parallel emission of said determined radio-frequency pulse by said RF coils of said coil array.

3. A method as claimed in claim 2 comprising determining said weighted basis functions of said decomposition algorithm by executing an algorithm in said computer that causes said approximated vector to be sparse, said algorithm being selected from the group consisting of a matching pursuit algorithm and a wavelet algorithm.

4. A method as claimed in claim 2 comprising storing respective weights of said weighted basis functions either in a matrix of basis functions or in said approximated vector.

5. A method as claimed in claim 2 comprising randomly distributing respective weights of said weighted basis functions in a matrix of basis functions and in said approximated vector.

6. A method as claimed in claim 2 comprising selecting said criterion from the group consisting of a number of said basis functions, and an error in approximation of said original vector represented as a ratio of said approximated vector to said original vector.

7. A method as claimed in claim 1 comprising employing, as said weighted basis functions, predetermined functions selected from the group of function types consisting of Harr, Symlets, Meyer, Daubechies, Coiflets, Gabor, and Fermi.

8. A method as claimed in claim 1 wherein said operating parameters form an original system matrix of said magnetic resonance apparatus, and comprising, in said computer:
approximating an approximated system matrix by decomposing said original system matrix into a finite number of further basis functions, to produce said approximated system matrix with a dimension that is less than a dimension of said original system matrix;
said further basis functions being a pseudo-inversion matrix corresponding to a matrix of said basis functions; and
determining said RF pulse also as a function of said approximated system matrix.

9. A method as claimed in claim 8 wherein said criterion is an error of said approximated system matrix represented as a ratio of said approximated system matrix to said original system matrix.

10. A method as claimed in claim 8 comprising approximating said approximated system matrix by:
determining said pseudo-inversion matrix of said matrix of said basis functions; and
applying said pseudo-inversion matrix to said original system matrix and thereby producing said approximated system matrix as a sparse matrix with a number of columns equal to a number of columns of said original system matrix and a number of rows of said approximated system matrix being less than a number of rows of said original system matrix.

11. A method as claimed in claim 8 comprising determining said RF pulse as a numerical solution of a linear equation system in which said approximated system matrix links a solution vector, that describes said RF pulse, with said spatial region represented as said approximated vector.

12. A method as claimed in claim 11 comprising obtaining said numerical solution using a technique selected from the group consisting of LU decomposition of said approximated system matrix, ILU decomposition of said approximated system matrix, Cholesky decomposition of said approximated system matrix, iterative solving techniques, and parallel computational techniques.

13. A method as claimed in claim 1 comprising selecting said operating parameters from the group consisting of a k-space trajectory in k-space along which magnetic resonance data are entered into k-space during emission of said radio-frequency pulse, a measured field map of a basic magnetic field that exists during emission of said RF pulse, and a measured RF field map in said selected region.

14. A magnetic resonance apparatus comprising:
a magnetic resonance data acquisition unit comprising a plurality of radio-frequency (RF) transmitting coils in a coil array;
a control computer configured to operate said coil array to cause time-parallel emission of an RF pulse by said plurality of RF transmitting coils, so as to influence a transfer magnetization in a specified spatial region of an object situated in said data acquisition unit;
said control computer being configured to receive a plurality of operating parameters for said magnetic resonance data acquisition unit;
said control computer being configured to represent said spatial region as an original vector and approximate said original vector, as an approximated vector, by decomposing said original vector into a finite number of weighted basis functions of a decomposition algorithm employed to decompose said original vector, to produce said approximated vector with a length that is less than a length of said original vector;
said control computer being configured to determine said radio-frequency pulse as a function of said operating parameters and said approximated vector; and
said control computer being configured to make the determined RF pulse available at an output of said control computer in an electronic form and to operate said RF coils of said coil array to emit said RF pulse.

* * * * *